United States Patent [19]
Ito

[11] 4,197,504
[45] Apr. 8, 1980

[54] COMMON INDICATOR UNIT FOR RADIO RECEIVER AND TRANSCEIVER

[75] Inventor: Tatsuo Ito, Kobe, Japan

[73] Assignee: Fujitsu Ten Limited, Kobe, Japan

[21] Appl. No.: 863,249

[22] Filed: Dec. 22, 1977

[30] Foreign Application Priority Data

Dec. 29, 1976 [JP] Japan ................... 51-159820

[51] Int. Cl.² ........................................ H04B 1/06
[52] U.S. Cl. ................................. 455/154; 455/75; 334/86
[58] Field of Search ............... 325/21, 306, 312, 316, 325/455, 22, 325, 16, 360, 15, 364, 464, 64; 334/6, 86, 87; 340/539; 324/78 D, 81, 78 R, 79 R, 79 D

[56] References Cited

U.S. PATENT DOCUMENTS

| 3,550,000 | 12/1970 | Grilk | 325/22 |
| 3,753,119 | 8/1973 | Close | 325/455 |
| 3,887,872 | 6/1975 | Sharpe | 325/22 |
| 4,013,957 | 3/1977 | Tojo | 325/455 |
| 4,024,477 | 5/1977 | Yamaguchi | 325/455 |

Primary Examiner—Robert L. Griffin
Assistant Examiner—Tommy P. Chin
Attorney, Agent, or Firm—Daniel Jay Tick

[57] ABSTRACT

A common indicator unit for a radio receiver and transceiver includes a segment type indicator consisting of a plurality of digits. An indication output corresponding to the receiving frequency of the radio receiver and an indication output corresponding to the channel of the transceiver are applied to the input terminal of the indicator after selection by switching.

1 Claim, 11 Drawing Figures

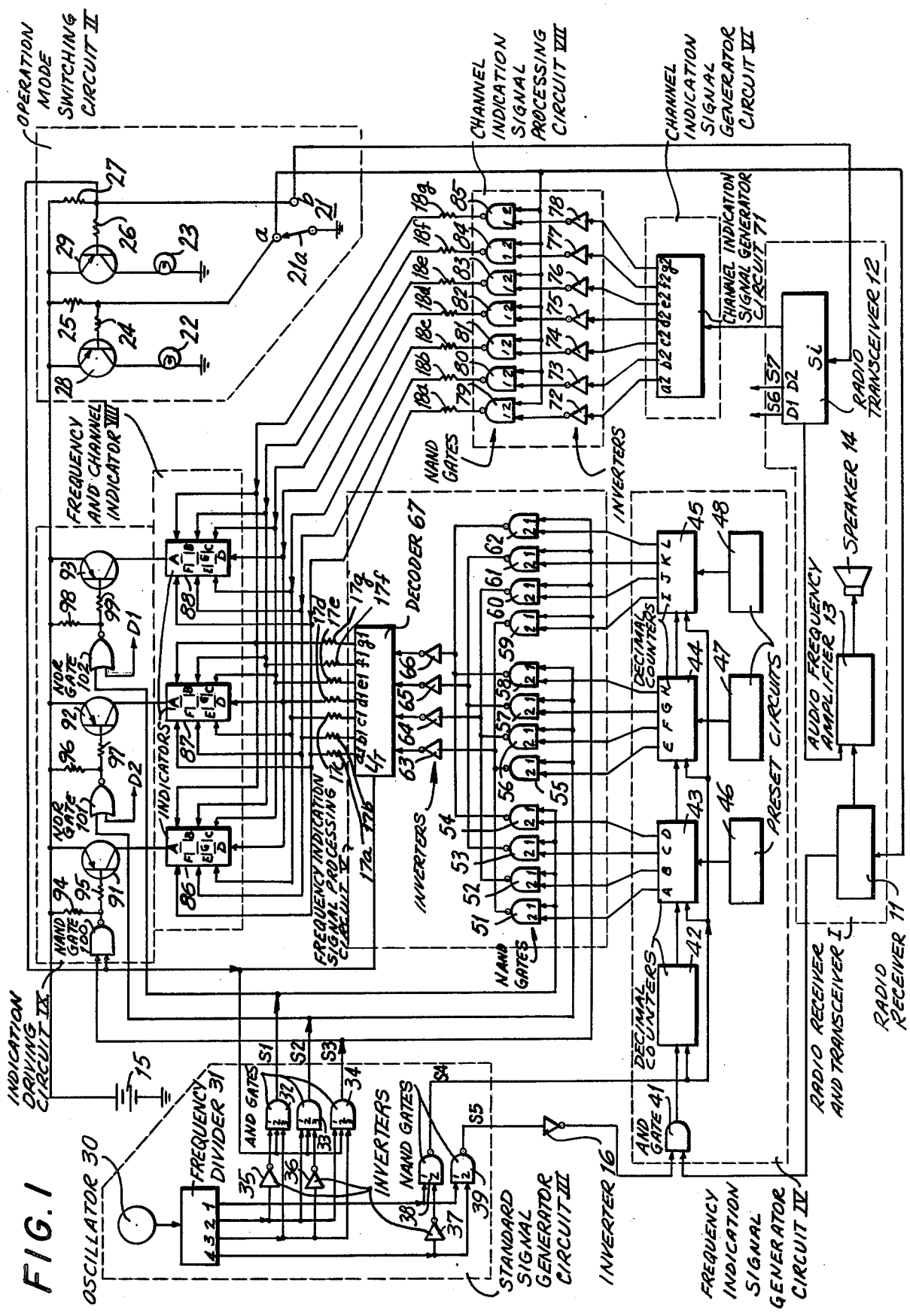

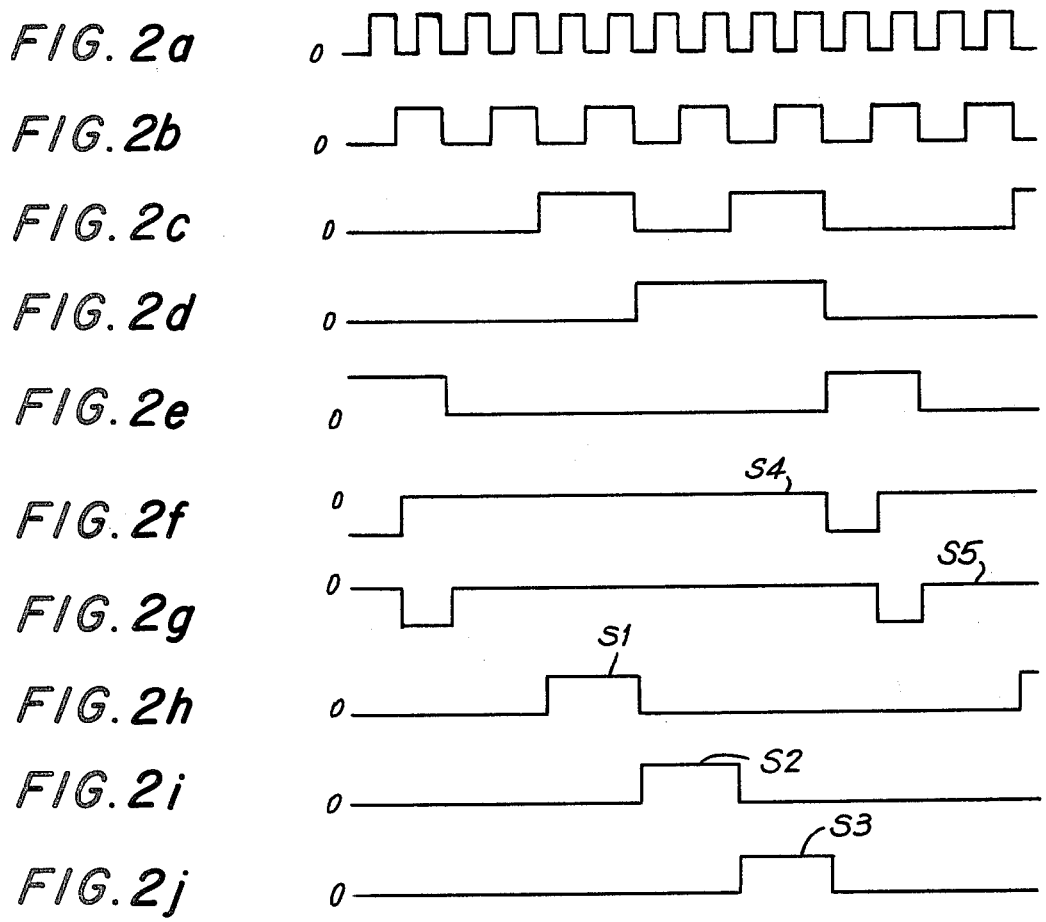

COMMON INDICATOR UNIT FOR RADIO RECEIVER AND TRANSCEIVER

BACKGROUND OF THE INVENTION

The present invention relates to a common indicator unit for a radio receiver and transceiver. More particularly, the invention relates to a channel indicator unit for common use in combination with a radio receiver and transceiver.

A radio receiver and transceiver are often used in combination. The reproduction system, or audio frequency circuits, of the combination receiver and transceiver are often used in common in an effort to keep the cost of the equipment low. However, the frequency indication of the receiver and the channel indication of the transceiver are provided mechanically and individually by known devices. The so-called analog indication method is used for the frequency indication. In the analog indication method, a dial pointer scans a scale. An indication mechanism is used for the channel indication. The indication mechanism utilizes an indication disc and a rotary switch for channel switching. The channel figures are entered at the rotary switch. The channel figures are indicated through an indication window provided adjacent the disc. These indication systems are provided at the front panel of the combined system. The front panel thus requires a large space, resulting in an increase in the size of the system.

On the other hand, attempts are currently being made to digitally provide each indication via a full electronic tuning circuit.

The principal object of the invention is to provide a common indicator unit for commonly indicating the frequency of a radio receiver and the channel of a radio transceiver by utilizing a digital indication system.

An object of the invention is to provide a common indicator unit having a small number of circuit components for commonly indicating the frequency of a radio receiver and the channel of a radio transceiver.

Another object of the invention is to provide a common indicator unit for commonly indicating the frequency of a radio receiver and the channel of a radio transceiver, which indicator unit is of simple structure and is inexpensive in manufacture.

Still another object of the invention is to provide a common indicator unit of small size, compact structure and simplified and small front panel for commonly indicating the frequency of a radio receiver and the channel of a radio transceiver.

BRIEF SUMMARY OF THE INVENTION

In accordance with the invention, a common indicator unit for a radio receiver and transceiver comprises a segment type indicator consisting of a plurality of digits. An indication output corresponding to the receiving frequency of the radio receiver and an indication output corresponding to the channel of the transceiver are applied to the input terminal of the indicator after selection by switching.

In accordance with the invention, a common indicator unit for a radio receiver and transceiver, the radio having receiving frequencies and the transceiver having transmitting and receiving channels, comprises a segment type indicator corresponding to the digits to be indicated. A first indication driving signal generator circuit generates a segment selection driving signal corresponding to the value of the receiving frequency of the radio receiver. A second indication driving signal generator circuit generates a segment selection driving signal corresponding to the selected channel number of the transceiver. A switching circuit connected between the first and second indication driving signal generator circuits and the indicator applies the segment selection driving signal generated by one of the first and second indication driving signal generator circuits to the indicator.

An operation mode switching circuit connected to the switching circuit visually indicates the operating condition of the radio receiver and transceiver in accordance with the output of the switching circuit.

The indicator has seven indication segments consisting of light emitting diodes connected to the first and second indication driving signal generator circuits. The segment selection driving signals of each of the first and second indication driving signal generator circuits have seven bits and selectively drive the light emitting diodes.

The radio receiver has a local oscillator. The first indication driving signal generator circuit comprises a gate circuit connected to the local oscillator of the radio receiver for extracting the frequency signal from the local oscillator for a specific period of time. Counter circuits of a plurality of digits are connected to the local oscillator and to the gate circuit for counting the frequency signal. A decoder connected between the gate circuit and the segment type indicator decodes the count outputs of the counter circuits and generates therefrom the segment selection driving signal. The segment selection driving signal has the same number of bits as the segments of said indicator.

In accordance with the invention, a common indicator unit for a radio receiver and transceiver, the radio having receiving frequency signals and the transceiver having transmitting and receiving channels, comprises a segment type indicator for a plurality of digits. The indicator has a plurality of input terminals. An indication control signal generator circuit repeatedly generates an indication control signal for sequentially selecting each digit of the indicator. A counter circuit of a plurality of digits connected to the radio receiver counts the receiving frequency signal of the radio receiver. A gate circuit connected to the counter circuit and to the indication control signal generator circuit sequentially extracts the count outputs of the counter circuit, one by one, in accordance with the indication control signal by providing as the input of the gate circuit the count outputs and the indication control signal. A first indication driving signal generator circuit connected to the radio receiver and the gate circuit generates a first segment selection driving signal corresponding to the selected receiving frequency of the radio receiver by decoding the count output of the counter after the count output passes through the gate circuit. The first indication driving signal generator circuit has output terminals connected to the input terminals of the indicator. An indication driving circuit connected to the gate circuit and the indicator sequentially applies a driving voltage to the indicator in accordance with the indication control signal of the indication control signal generator circuit. A second indication driving signal generator circuit connected to the transceiver and the gate circuit generates a second segment selection driving signal corresponding to the selected channel number of the transceiver. A changeover switching circuit connected between each of the first and second indication driving signal generator circuits and the indicator applies one of the first and second segment selection driving signals to the indicator.

BRIEF DESCRIPTION OF THE DRAWINGS

In order that the invention may be readily carried into effect, it will now be described with reference to the accompanying drawings, wherein:

FIG. 1 is a block and circuit diagram of an embodiment of the indicator unit of the invention for a radio receiver and transceiver; and FIGS. 2a, 2b, 2c, 2d, 2e, 2f, 2g, 2h, 2i and 2j are graphical presentations explaining the operation of the embodiment of FIG. 1.

DETAILED DESCRIPTION OF THE INVENTION

As shown in FIG. 1, a radio receiver 11 comprises an antenna circuit, a radio frequency (RF) amplifier, a local oscillator, a mixer, an intermediate frequency (IF) amplifier and a detector, none of which are shown in the FIGS. A radio transceiver 12 comprises a transmitting/receiving antenna and a transmitting/receiving circuit. An audio frequency (AF) amplifier 13 and a speaker 14 are used in common by the radio receiver and transceiver. These circuit components of the radio receiver and transceiver I are well known, and are therefore not described.

The indicator unit of the invention comprises an operation mode switching circuit II, a standard signal generator circuit III, a frequency indication signal generator circuit IV, a frequency indication signal processing circuit V, a channel indication signal generator circuit VI, a channel indication signal processing circuit VII, a frequency and channel indicator VIII, and an indication driving circuit IX.

The operation mode switching circuit II functions to switch the radio receiver and transceiver operation and comprises a changeover switch 21, indicator lamps 22 and 23, resistors 24, 25, 26 and 27 and transistors 28 and 29. The switch arm 21a of the changeover switch 21 is grounded. The fixed contact a of the switch 21 is connected to a common point in the connection of the resistors 24 and 25 and to the drive control input terminal Si of the radio receiver 11. The fixed contact b of the switch 21 is connected to a common point in the connection of the resistors 26 and 27 and to the drive control input terminal Si of the transceiver 12. The emitter electrode of the transistor 28 is connected to a DC power supply or battery 15. The collector electrode of the transistor 28 is connected to ground via the indicator lamp 22. The base electrode of the transistor 28 is connected to the end of the resistor 24 opposite that connected to the switch contact a. The emitter electrode of the transistor 29 is connected to the battery 15. The collector electrode of the transistor 29 is connected to ground via the indicator lamp 23. The base electrode of the transistor 29 is connected to the end of the resistor 26 opposite that connected to the switch contact b.

The standard signal generator circuit III comprises an oscillator 30, a frequency divider 31, a plurality of AND gates 32, 33 and 34, a plurality of inverters 35, 36 and 37 and a pair of NAND gates 38 and 39. The oscillator 30 outputs the clock pulse of 1 kiloHertz or kHz, shown in FIG. 2a. The divider 31 divides the clock pulse frequency and has four output terminals 1, 2, 3 and 4. The divided output produced by the divider 31 is shown in FIGS. 2b, 2c, 2d and 2e.

The output terminal 1 of the divider 31 is connected to the input terminal 1 of the NAND gates 38 and 39. The output terminal 2 of the divider 31 is connected to the input terminal of the inverter 35 and to the input terminal 1 of the AND gates 33 and 34. The output terminal 3 of the divider 31 is connected to the input terminal of the inverter 36 and to the input terminal 3 of the AND gates 32 and 34. The output terminal 4 of the divider 31 is connected to the input terminal of the inverter 37 and to the input terminal 2 of the NAND gate 39. The output terminal of the inverter 35 is connected to the input terminal 1 of the AND gate 32 and the output terminal of the inverter 36 is connected to the input terminal 3 of the AND gate 33. The output terminal of the inverter 37 is connected to the input terminal 2 of the NAND gate 38.

The input terminals 2 of the AND gates 32, 33 and 34 are connected to a fixed contact b of the changeover switch 21. The output terminals of the AND gates 32, 33 and 34 are connected to the frequency indication signal processing circuit V and the indication driving circuit IX, hereinafter described. Thus, indication control signals S1, S2 and S3, shown in FIGS. 2h, 2i and 2j, respectively, are applied to the circuits V and IX. The output terminals of the NAND gates 38 and 39 are connected to the frequency indication signal generator circuit IV, hereinafter described. The reset signal S4 and the gate signal S5, shown in FIGS. 2f and 2g, respectively, are applied to the circuit IV. The signals S4 and S5 are negative pulses having a pulse period of 10 msec and a pulse width of 1 msec.

The frequency indication signal generating circuit IV for the radio receivier comprises an AND gate 41, a plurality of counters 42, 43, 44 and 45 and a plurality of preset circuits 46, 47 and 48. The input terminals 1 and 2 of the AND gate 41 are connected to the inverter 16 and the local oscillator of the radio receiver 11, respectively. Thus, the AND gate 41 generates a pulse signal corresponding to the local oscillator signal by sampling the local oscillator signal via the gate signal S5. The counters 42, 43, 44 and 45 comprise presettable decimal counters. The counters 42, 43, 44 and 45 receive the pulse signal. On the other hand, the values related to the intermediate frequency of the receiver are preset as complements by the preset circuits 46, 47 and 48.

The counters 42, 43, 44 and 45 also receive the reset signal S4, and count the outputs of the preset circuits 46, 47 and 48 when said reset signal is input. Upon completion of the counting operation, the counters 42, 43, 44 and 45 count the pulse signals in addition to the preset complement number on the basis of the gate signal S5. The counters 42, 43, 44 and 45 finally provide an output which is a BCD signal of a value corresponding to the receiving frequency from each output state A to L of said counters. In other words, the counters 42, 43, 44 and 45 are in the initial state, with all bits zero, when the pulses are input in a number corresponding to the intermediate frequency, so that the counter value corresponds to the receiving frequency. This is described hereinafter in greater detail.

When the intermediate frequency of radio receiver is 460 kHz and the local oscillation frequency is habitually higher than the receiving frequency, for example, the preset value becomes 0540. Since the lowest digit of the radio broadcast frequency, although it is usually indicated by four digits, is always zero, in the embodiment of the invention, an indication of the lowest digit is omitted for simplification and the frequency is indicated by the figures of three digits in units of 10 kHz. The preset circuits 46, 47 and 48 therefore supply BCD signals of values corresponding to "4," "5" and "0" to the counters 43, 44 and 45, respectively. A known read only memory is used as each of the preset circuits 46, 47 and 48.

The frequency indication signal processing circuit V for the radio receiver receives as inputs, sequentially, one by one, on a time sharing basis, the BCD signal outputs from the counters 43, 44 and 45. The frequency indication signal processing circuit V functions to decode the input signals from the counters 43, 44 and 45. The frequency indication signal processing circuit V comprises a plurality of NAND gates 51, 52, 53, 54, 55, 56, 57, 58, 59, 60, 61 and 62, a plurality of inverters 63, 64, 65 and 66 and a decoder 67. The NAND gates 51 to 62 are provided in three groups of four. The first group consists of the NAND gates 51, 52, 53 and 54. The second group consists of the NAND gates 55, 56, 57 and 58. The third group consists of the NAND gates 59, 60, 61 and 62.

The input terminals 1 of the NAND gates 51 to 54 of the first group are connected to the output terminal of the AND gate 32 of the standard signal generator circuit III. The input terminals 1 of the NAND gates 55 to 58 of the second group are connected to the output terminal of the AND gate 33 of the standard signal generator circuit III. The input terminals 1 of the NAND gates 59 to 62 of the third group are connected to the output terminal of the AND gate 34 of the standard signal generator circuit III. The input terminals 2 of the NAND gates 51 to 54 of the first group are connected to the output stages A, B, C and D, respectively, of the counter 43 of the frequency indication signal generator circuit IV. The input terminals 2 of the NAND gates 55 to 58 of the second group are connected to the output stages E, F, G and H, respectively, of the counter 44 of the frequency indication signal generator circuit IV. The input terminals 2 of the NAND gates 59 to 62 of the third group are connected to the outgoing stages I, J, K and L, respectively, of the counter 45 of the frequency indication signal generator circuit IV.

The output terminals of the NAND gates 51, 55 and 59 are connected in common to the input terminal of the inverter 63. The output terminals of the NAND gates 52, 56 and 60 are connected in common to the input terminal of the inverter 64. The output terminals of the NAND gates 53, 57 and 61 are connected in common to the input terminal of the inverter 65. The output terminals of the NAND gates 54, 58 and 62 are connected in common to the input terminal of the inverter 66. The output terminals of the inverters 63, 64, 65 and 66 are connected to the input terminals of the decoder 67. The decoder 67 has seven output terminals al to gl and provides an indication segment driving signal at said output terminals. The decoder 67 also has a lamp test terminal L/T which is connected to the fixed terminal b on the transceiver side of the changeover switch 21. The lamp test terminal L/T provides high level outputs at all the output terminals of the decoder when a low level signal is provided as input thereto.

The channel indication signal generator circuit VI for the transceiver 12 comprises a channel indication signal generator circuit 71 having seven output terminals a2, b2, c2, d2, e2, f2 and g2. The channel indication signal generator circuit 71 generates an indication driving signal indicating the channel number at the output terminal of the transceiver 12 interlocking with the changeover operation of the channel switching circuit of said transceiver.

The channel indication signal processing circuit VII for the transceiver 12 functions to apply the indication driving signal to the indicator only when said transceiver is in use. The channel indication signal processing circuit comprises a plurality of inverters 72, 73, 74, 75, 76, 77 and 78 and a plurality of NAND gates 79, 80, 81, 82, 83, 84 and 85. The input terminals of the inverters 72, 73, 74, 75, 76, 77 and 78 are connected to the output terminals a2, b2, c2, d2, e2, f2 and g2, respectively, of the channel indication signal generator circuit 71. The output terminals of the inverters 72, 73, 74, 75, 76, 77 and 78 are connected to the input terminals 1 of the NAND gates 79, 80, 81, 82, 83, 84 and 85, respectively. The NAND gates 79, 80, 81, 82, 83, 84 and 85 are provided for driving segments and their input terminals 2 are connected to the fixed terminal a of the radio side of the changeover switch 21.

The frequency and channel indicator VIII indicates the receiving frequency of the radio receiver 12 and the channel number of the transceiver. The frequency and channel indicator VIII comprises a plurality of segment type indicators 86, 87 and 88 for indicating a plurality of digits. The indicators 86, 87 and 88 indicate three digits in the illustrated embodiment of the invention. Each of the indicators 86, 87 and 88 has seven segments A, B, C, D, E, F and G, consisting of light emitting diodes or LEDs. The negative terminals of the indication segment groups of each digit are connected to the output terminals a1, b1, c1, d1, e1, f1 and g1 of the decoder 67 of the frequency indication signal processing circuit V, via resistors 17a to 17g, and to the output terminals of the NAND gates 79, 80, 81, 82, 83, 84 and 85, via resistors 18a to 18g.

The output terminal a1 of the decoder 67 is connected via the resistor 17a to the segments G of the indicators 86, 87 and 88, and the output terminal of the NAND gate 79 is connected to said segments via the resistor 18a. The output terminal b1 of the decoder 67 is connected via the resistor 17b to the segments F of the indicators 86, 87 and 88, and the output terminal of the NAND gate 80 is connected to said segments via the resistor 18b. The output terminal c1 of the decoder 67 is connected via the resistor 17c to the segments E of the indicators 86, 87 and 88, and the output terminal of the NAND gate 81 is connected to said segments via the resistor 18c. The output terminal d1 of the decoder 67 is connected via the resistor 17d to the segments D of the indicators 86, 87 and 88, and the output terminal of the NAND gate 82 is connected to said segments via the reisitor 18d. The output terminal e1 of the decoder 67 is connected via the resistor 17e to the segments C of the indicators 86, 87 and 88, and the output terminal of the NAND gate 83 is connected to said segments via the resistor 18e. The output terminal f1 of the decoder 67 is connected via the resistor 17f to the segments B of the indicators 86, 87 and 88, and the output terminal of the NAND gate 84 is connected to said segments via the resistor 18f. The output terminal g1 of the decoder 67 is connected via the resistor 17g to the segments A of the indicators 86, 87 and 88, and the output terminal of the NAND gate 85 is connected to said segments via the resistor 18g.

The relation between the indication segment and the true value of the indication is shown in the following truth table. In the following table, "1" indicates a high level and "0" indicates a low level.

| Indication value | Indication segment | | | | | | |
|---|---|---|---|---|---|---|---|
| | A | B | C | D | E | F | G |
| 1 | 1 | 0 | 0 | 1 | 1 | 1 | 1 |
| 2 | 0 | 0 | 1 | 0 | 0 | 1 | 0 |
| 3 | 0 | 0 | 0 | 0 | 1 | 1 | 0 |
| 4 | 1 | 0 | 0 | 1 | 1 | 0 | 0 |
| 5 | 0 | 1 | 0 | 0 | 1 | 0 | 0 |
| 6 | 0 | 1 | 0 | 0 | 0 | 0 | 0 |
| 7 | 0 | 0 | 0 | 1 | 1 | 1 | 1 |
| 8 | 0 | 0 | 0 | 0 | 0 | 0 | 0 |
| 9 | 0 | 0 | 0 | 0 | 1 | 0 | 0 |
| 0 | 0 | 0 | 0 | 0 | 0 | 0 | 1 |

The indication driving circuit IX supplies a driving current to the indicators 86, 87 and 88. The indication driving circuit IX comprises a 3-digit indication driving circuit having a plurality of driving transistors 91, 92 and 93, a plurality of resistors 94, 95, 96, 97, 98 and 99, a NAND gate 100 and a pair of NOR gates 101 and 102. The gates 100, 101 and 102 control the transistors. The collector electrode of the first transistor 91 is connected to the positive terminals of the indication segment group of the indicator 86. The emitter electrode of the transistor 91 is connected to the power supply 15. The base electrode of the transistor 91 is connected to the end of the resistor 95 opposite that connected to the output terminal of the NAND gate 100.

The input terminal 1 of the NAND gate 100 is connected to the output terminal of the AND gate 34 of the standard signal generator circuit III and the input terminal 2 of said NAND gate is connected to the fixed terminal b of the changeover switch 21 of the operation mode switching circuit II. The output terminal of the NAND gate 100 is connected to a common point in the connection between the resistors 94 and 95. The collector electrode of the second transistor 92 is connected to the positive terminals of the indication segment group of the indicator 87. The emitter electrode of the transistor 92 is connected to the power supply 15. The base electrode of the transistor 92 is connected to the end of the resistor 97 opposite that connected to the output terminal of the NOR gate 101. The input terminal 1 of the NOR gate 101 is connected to the output terminal of the AND gate 33 of the standard signal generator circuit III and the input terminal 2 of said NOR gate is connected to the indication control signal output terminal D2 of the transceiver 12. The output terminal of the NOR gate 101 is connected to a common point in the connection between the resistors 96 and 97.

The collector electrode of the third transistor 93 is connected to the positive terminals of the indication segment group of the indicator 88. The emitter electrode of the transistor 93 is connected to the power supply 15. The base electrode of the transistor 93 is connected to the end of the resistor 99 opposite that connected to the output terminal of the NOR gate 102. The input terminal 1 of the NOR gate 102 is connected to the output terminal of the AND gate 32 of the standard signal generator circuit III and the input terminal 2 of said NOR gate is connected to the indication control signal output terminal D1 of the transceiver 12. The output terminal of the NOR gate 102 is connected to a common point in the connection between the resistors 98 and 99.

The control signals S6 and S7 output from the indication control signal output terminals D1 and D2, respectively, of the transceiver 12 are pulse signals having a specific time delay between them, as is the case with the indication control signals S1, S2 and S3 output from the AND gates 32, 33 and 34 of the standard signal generator circuit III. The signal S6 leads the signal S7 in phase.

The operation of the indicator unit of the invention is explained, as follows, by reference to FIGS. 1 and 2. As hereinbefore described, the indicator unit of the invention is capable of providing two types of indications for the receiving frequency of radio receiver 11 and the channel indication of the transceiver 12. Of course, the two types of functions are locked by the changeover switch 21 and the logic circuit, and only one function is provided at a time.

The operation of indicating the receiving frequency is thus explained first, as follows. When the switch arm 21a of the changeover switch 21 is set so that it electrically contacts the fixed contact a of the radio side, the drive control circuit of the radio receiver 11 (not shown in the FIGS.) operates and the desired radio broadcast signal is thereby amplified by the AF amplifier 13. The amplified signal is then reproduced by the speaker 14. At the same time, the transistor 28 is switched ON and the indication lamp 22 is energized and illuminated and indicates that the radio receiver is in receiving condition.

On the other hand, the AND gate 41 samples the local oscillator signal via the gate signal S5 and applies the sampling output, shown in FIG. 2a, to the counters 42, 43, 44 and 45. Therefore, the counters 42, 43, 44 and 45 count the values corresponding to the receiving frequency and store the counted value. If the receiving frequency is 1560 kHz, for example, the counter 43 generates a BCD signal corresponding to the value of "6," the counter 44 generates a BCD signal corresponding to the value of "5" and the counter 45 generates a BCD signal corresponding to the value of "1." These signals are then supplied to the input terminals 2 of the NAND gates 51, 52, 53, 54, 55, 56, 57, 58, 59, 60, 61 and 62. As hereinbefore explained, the NAND gates 51 to 62 form three groups of four gates.

Since the indication control signals S1, S2 and S3, shown in FIGS. 2h, 2i and 2j, which are different in timing, are provided as inputs to the input terminals 1 of the NAND gates 51 to 62 from the AND gates 32, 33 and 34, said NAND gates permit the BCD signals to pass in the sequence of the first NAND gate group 51, 52, 53 and 54, then the second NAND gate group 55, 56, 57 and 58, and the third NAND gate group 59, 60, 61 and 62 due to the logic relation between the indication control input signals and the input terminals 2. In other words, the NAND gates 51, 52, 53 and 54 provide an output BCD signal of 0110, the NAND gates 55, 56, 57 and 58 provide an output BCD signal of 0101, and the NAND gates 59, 60, 61 and 62 provide an output BCD signal of 0001.

The BCD signals are sequentially supplied to the decoder 67 via the inverters 63, 64, 65 and 66. The decoder 67 converts the BCD signals to decimal signals and codes them in a code just suitable for desired figure patterns of the indication segment. Thus, for example, in indicating the value "6," as is apparent from the truth table, the segments A, C, D, E, F and G are required to be illuminated. The output terminals a1, b1, c1, d1, e1, f1 and g1 of the decoder 67 therefore provide an output of 0100000.

Since the indication control signals S1, S2 and S3 are also supplied to the NOR gates 101 and 102, and to the NAND gate 100, when the output terminal of the NOR gate 102 is at the low level due to the control signal S1, the transistor 93 is switched ON. Then, when the output terminal of the NOR gate 101 is at the low level due to the control signal S2, the transistor 92 is switched ON. Furthermore, when the output terminal of the NAND gate 100 is at the low level due to the control signal S3, the transistor 91 is switched ON. As a result, the driving current is supplied to the positive terminals of the indication segment groups in the sequence 88, 87, 86.

The 3-digit indicator therefore provides the following indication in accordance with the supply of the indication control signals S1, S2 and S3. More particularly, due to the relation between the supply time of the driving current and the segment selection of the decoder 67, only the indicator 88 indicates the value "6," then only the indicator 87 indicates the value "5" and then only the indicator 86 indicates the value "1." Since the differnece in time of the indications is 2msec in the preferred embodiment, as described, all the indicators 86, 87 and 88 appear to become illuminated simultaneously in such indicating condition. Thus, the broadcast frequency of 1560 kHz being received may be indicated visually by the 3-digit indicator.

When the switch arm 21a of the changeover switch 21 is set so that it is in electrical contact with the fixed contact b on the transceiver side, the driving control circuit of the transceiver 12 (not shown in the FIGS.) operates at first. Thus, for example, if the distant transceiver 12 is in receiving condition, the voice signal from said transceiver may be reproduced through the AF amplifier 13 and the speaker 14. Simultaneously, the transistor 29 is switched ON and the indication lamp 23 is energized and illuminated, indicating that the transceiver 12 is in operating condition.

Under these circumstances, the input terminals 2 of the AND gates 32, 33 and 34 and the input terminals 2 of the NAND gate 100 are at the low level. The output terminals of the AND gates 32, 33 and 34 are thereby at the low level and the output terminal of the NAND gate 100 is at the high level. Thus, the generated indication control signals S1, S2 and S3 are blocked and the transistor 91 is locked in OFF condition. When the indication control signals cease to be generated, the NAND gates 51 to 62 are continuously closed.

When the transistor 91 is switched OFF, the supply of the driving current to the indicator 86 of the highest digit ceases, so that said indicator does not become energized or illuminated. However, since the maximum number of channels of the transceiver 12 is 40, there is no problem if the indicator 86 is not energized or illuminated.

When the changeover switch 21 is set to the transceiver side, the lamp test terminal L/T of the decoder 67 is at the low level and, therefore, all of the output terminals a1, b1, c1, d1, e1, f1, and g1 are at the high level, so that only the channel indicator of the transceiver becomes effective for the indicator. When the transceiver 12 is operated, the indication control signals S6 and S7 are sequentially provided as outputs of said transceiver at a specific time delay. The indication control signals S6 and S7 are applied to the NOR gates 102 and 101, respectively. The output terminals of the NOR gates 102 and 101 are at the low level, sequentially, due to the indication control signals S6 and S7. For this reason, the transistors are repeatedly switched ON and OFF in the sequence of the transistors 93 and 92, at a specific time delay.

On the other hand, the output terminals a2, b2, c2, d2, e2, f2 and g2 of the channel indication signal generator circuit 71 outputs the indication driving signal indicating the channel number used. The outputs of the channel indication signal generator circuit 71 are applied to the input terminals 1 of the NAND gates 79, 80, 81, 82, 83, 84 and 85 via the inverters 72, 73, 74, 75, 76, 77 and 78. The NAND gates 79, 80, 81, 82, 83, 84 and 85 open, since the input terminals 2 of said NAND gates are already at the high level due to the operation of changeover switch 21. The NAND gates 79, 80, 81, 82, 83, 84 and 85 permit only the driving signal to pass. The driving signal is supplied to the indication segment groups of the indicators 87 and 88 via the resistors 18a, 18b, 18c, 18d, 18e, 18f and 18g.

The indication driving signal is synchronized with the indication control signals S6 and S7 and is alternately provided as an output in the sequence of the lower channel digits and upper channel digits. Therefore, if the channel number is 25, for example, the transistor 93 is switched ON by the indication control signal S6 and the driving voltage is thereby applied to the positive terminals of the indication segment group of the indicator 88. Simultaneously, an indication driving signal of 0100100 is output from the NAND gates 79, 80, 81, 82, 83, 84 and 85, so that the negative terminals of the indication segments A, B, C, F and G of the indicator 88 are at the low level. As a result, indication segments A, B, C, F and G are illuminated, and the indicator 88 indicates the lower part of the digit figure "5."

The transistor 92 is thereafter switched ON by the indication control signal S7, and the driving voltage is applied to the indicator 87. Simultaneously, an indication driving signal of 0010010 is applied to the indicator 87 from the NAND gates 79, 80, 81, 82, 83, 84 and 85. The indicator 87 therefore indicates the upper part of the digit figure "2." In this indicating condition, both indicators 87 and 88 appear to be illuminated simultaneously, as hereinbefore described. Thus, the channel number used may be indicated visually by the 2-digit indicator.

As is apparent from the foregoing description, the indicator unit of the invention is capable of visually indicating, in common, the receiving frequency of the radio receiver and the channel number of the transceiver by using a single segment type indicator. Economy in manufacture is thus realized due to a reduction in the number of circuit components. Furthermore, the indicator is small in size, because the indicator occupies less space on the front panel of the cabinet of the receiver and transceiver. In addition, the arrangement of the indicator is simplified for the front panel. The indicator unit of the invention is thus very desirably adapted to a combined radio receiver and transceiver.

While the invention has been described by means of a specific example and in a specific embodiment, I do not wish to be limited thereto, for obvious modifications will occur to those skilled in the art without departing from the spirit and scope of the invention.

I claim:
1. A common indicator unit for a radio receiver and transceiver, the radio having receiving frequency sig- nals and the transceiver having transmitting and receiving channels, said common indicator unit comprising a segment type indicator for a plurality of digits, said indicator having a plurality of input terminals;

an indication control signal generator circuit for repeatedly generating an indication control signal for sequentially selecting each digit of the indicator;

a counter circuit of a plurality of digits connected to the radio receiver for counting the receiving frequency signal of said radio receiver;

a first gate circuit connected to the counter circuit and to the indication control signal generator circuit for sequentially extracting the count outputs of the counter circuits, one by one, in accordance with the indication control signal by providing as the input of said first gate circuit said count outputs and said indication control signal;

an operation mode switching circuit for generating a signal indicating the operating condition of the radio receiver and the transceiver, said operation mode switching circuit including a manually operated changeover switch for selecting an indication of one of the radio receiver and the transceiver;

a first indication driving signal generator circuit connected to the radio receiver and the first gate circuit for generating a first segment selection driving signal corresponding to the selected receiving frequency of the radio receiver by decoding the count output of the counter after said count output passes through said first gate circuit, said first indication driving signal generator circuit comprising output terminals connected to the input terminals of said indicator and a lamp test terminal connected to the output terminal of said operation mode switching circuit, said first indication driving signal generator circuit compulsorily setting a no signal condition at said output terminals when a signal indicating the operating condition of the transceiver is supplied to said lamp test terminal;

an indication driving circuit connected to the indication control signal generator circuit and the indicator for sequentially applying a driving voltage to said indicator in accordance with the indication control signal of the indication control signal generator circuit;

a second indication driving signal generator circuit connected to the transceiver and the first gate circuit for generating a second segment selection driving signal corresponding to the selected channel number of said transceiver;

changeover switching means connected between each of the first and second indication driving signal generator circuits and said indicator for applying one of the first and second segment selection driving signals to said indicator; and a second gate circuit having output terminals connected to the input terminals of said indicator, said second gate circuit passing the second segment selection driving signal when the signal indicating the operating condition of the transceiver is provided by respectively supplying the second segment selection driving signal and the signal indicating the operating condition of the transceiver.

* * * * *